United States Patent
Maier et al.

(10) Patent No.: US 7,795,871 B2
(45) Date of Patent: Sep. 14, 2010

(54) NMR RESONATOR CONFIGURED AS AN INSULATED FOIL, CONDUCTIVELY COATED ON BOTH SIDES

(75) Inventors: Diether Maier, Rheinstetten (DE); Michael Maixner, Bietigheim (DE)

(73) Assignee: Bruker Biospin GmbH, Rheinstetten (DE)

(*) Notice: Subject to any disclaimer, the term of this patent is extended or adjusted under 35 U.S.C. 154(b) by 170 days.

(21) Appl. No.: 12/292,056

(22) Filed: Nov. 12, 2008

(65) Prior Publication Data
US 2009/0121716 A1    May 14, 2009

(30) Foreign Application Priority Data
Nov. 13, 2007 (DE) .................. 10 2007 053 976

(51) Int. Cl.
*G01V 3/00* (2006.01)
(52) U.S. Cl. ...................... 324/318; 324/322
(58) Field of Classification Search ........ 324/300–322; 600/407–445; 333/227, 219, 182; 607/2, 607/63; 361/303
See application file for complete search history.

(56) References Cited

U.S. PATENT DOCUMENTS

| | | | |
|---|---|---|---|
| 4,981,838 A * | 1/1991 | Whitehead ............... | 505/210 |
| 5,276,398 A * | 1/1994 | Withers et al. ........... | 324/318 |
| 5,594,342 A | 1/1997 | Brey | |
| 6,087,832 A * | 7/2000 | Doty ....................... | 324/318 |
| 6,411,092 B1 * | 6/2002 | Anderson ................. | 324/319 |
| 6,751,847 B1 * | 6/2004 | Brey et al. ............... | 29/606 |
| 7,675,288 B2 * | 3/2010 | Lee et al. ................. | 324/322 |
| 2008/0049376 A1 * | 2/2008 | Stevenson et al. ........ | 361/302 |

FOREIGN PATENT DOCUMENTS

JP    1046637    8/1987

OTHER PUBLICATIONS

Barnard T. Ghim et al. "Design and Fabrication of Copper-Film Loop-Gap Resonators", Journal of Magnetic Resonance, Series A 120, 72-76 (1996).

* cited by examiner

*Primary Examiner*—Brij B Shrivastav
(74) *Attorney, Agent, or Firm*—Paul Vincent

(57) ABSTRACT

A nuclear magnetic resonance (NMR) resonator (1; 31) comprising an inductive section (6) and a capacitive section (6a), wherein the inductive section (6) is band-shaped and surrounds a substantially cylindrical volume under investigation (5), wherein the capacitive section (6a) is formed from one or more discrete capacitor(s) (13; 13a, 13b, 13c, 13d), and wherein the ends (7, 8) of the band-shaped inductive section (6) are connected through one or several capacitor(s) (13; 13a, 13b, 13c, 13d) of the capacitive section (6a), is characterized in that the inductive section (6) is formed from a dielectric flexible foil (2) which is conductively coated on both sides and the ends (7, 8) of the band-shaped inductive section (6) overlap, wherein the outer coating (4) of the inner end (7) is electrically conductingly connected to the inner coating (3) of the outer end (8), with one or more through-connections (10) being provided in the area of the inner end (7) of the band-shaped inductive section (6), and the outer coating (4) being connected in the area of the outer end (8) to the inner coating (3) in the area of the inner end (7) via one or more capacitor(s) (13; 13a, 13b, 13c, 13d) and one or several through-connection(s) (10). The inventive NMR resonator for low-resolution NMR has a simple construction and provides NMR measurements of improved quality at low resonance frequencies.

17 Claims, 3 Drawing Sheets

NMR RESONATOR CONFIGURED AS AN INSULATED FOIL, CONDUCTIVELY COATED ON BOTH SIDES

This application claims Paris Convention priority to DE 10 2007 053 976.4 filed on Nov. 13, 2007 the entire disclosure of which is hereby incorporated by reference.

BACKGROUND OF THE INVENTION

The invention concerns a nuclear magnetic resonance (NMR) resonator comprising an inductive section and a capacitive section, wherein the inductive section is band-shaped and surrounds a substantially cylindrical volume under investigation, wherein the capacitive section is formed from one or several discrete capacitor(s), and wherein the ends of the band-shaped inductive section are connected through the one or several capacitor(s) of the capacitive section.

An NMR resonator of this type is disclosed e.g. in DE 42 23 909 A1.

Nuclear magnetic resonance spectroscopy is an effective method of instrumental analysis. RF (radio frequency) pulses are irradiated into a sample that is disposed in a static magnetic field, and the RF reaction of the sample is measured. The RF reaction provides information about the properties of the sample. NMR resonators are used to irradiate RF pulses and to read out the RF sample reaction. The resonance frequency of the NMR resonators must thereby be adjusted to the respective measurement.

For so-called high-resolution NMR, very strong static magnetic fields are used, which are usually generated by helium-cooled superconducting coil systems. High-resolution NMR produces detailed, complete NMR spectra that provide an exact analysis of the chemical composition of a sample, e.g. identification and determination of the amount of different binding types. The resonance frequencies with respect to protons are typically within a range of some hundreds of mega hertz (MHz).

However, for so-called low-resolution NMR (also called TD-NMR, TD=time domain), weaker static magnetic fields are used, which can be generated with permanent magnets. Low-resolution NMR enables determination of individual properties of samples with simple and inexpensive apparatus, e.g. the fraction of a certain substance in a sample. The resonance frequencies with respect to protons are typically within a range of some tens of MHz.

An NMR resonator substantially represents an oscillating circuit that comprises a capacitive section (with capacitance C) and an inductive section (with inductance L). The resonance frequency f of the NMR resonator is thereby determined in accordance with the formula $f=1/(2\pi\sqrt{LC})$. The resonance frequency of an NMR resonator can therefore be adjusted through suitable selection of L and C.

FIG. 4 of the above-mentioned document DE 42 23 909 A1 shows an NMR resonator with a C-shaped bent slotted metal sheet (split ring), the ends of which are connected to one or several capacitor(s). NMR resonators of this type and similar types are currently also used in low-resolution NMR, e.g. for measuring protons in a 40 MHz magnet. The resonance frequency of the above-mentioned resonator type can be adjusted through suitable selection of the capacitance C (e.g. of the capacitor(s)).

However, some applications of low-resolution NMR require particularly low resonance frequencies. An NMR resonator with a resonance frequency of approximately 10 MHz is e.g. required for measuring C13 atoms in the above-mentioned 40 MHz magnet.

If the capacitance C of the resonator type disclosed in DE 42 23 909 A1 is increased in order to reduce the resonance frequency to a range of about 10 MHz, the quality of the NMR measuring results deteriorates considerably.

A further NMR resonator with a spirally bent, band-shaped section is disclosed e.g. in DE 10 2005 024 773 B3 (FIG. 2). The inner end of the band-shaped section is contacted via an axial lead-through conductor. However, this NMR resonator is mechanically unstable and is very difficult to produce with precision. The usable volume under investigation is also quite small due to the spiral shape.

There are further NMR resonators which comprise a solenoid coil with numerous windings as the inductive section. NMR resonators of this type require a support body inside the solenoid coil in order to stabilize the conductor windings, in particular, with respect to acoustic vibrations. The support body considerably reduces the usable volume under investigation. This type of resonator is also quite expensive to produce.

It is therefore the underlying purpose of the invention to provide an NMR resonator for low-resolution NMR, which has a simple construction and provides NMR measurements of improved quality with low resonance frequencies.

SUMMARY OF THE INVENTION

This object is achieved by an NMR resonator of the above-mentioned type, which is characterized in that the inductive section is formed by a dielectric flexible foil which is conductively coated on two sides, wherein the ends of the band-shaped inductive section overlap each other, and the outer coating of the inner end is electrically conductingly connected to the inner coating of the outer end, and with one or more through-connections provided in the area of the inner end of the band-shaped, inductive section, the outer coating in the area of the outer end being connected to the inner coating in the area of the inner end via one or several capacitor(s) and one or several through-connection(s).

In low-resolution NMR, the quality of an NMR measurement is limited by the Q factor of the NMR resonator that is used. The Q factor of an NMR resonator is thereby mainly defined by two determining variables: 1) the ohmic losses (resistance R) in the inductive section and 2) the dielectric losses (loss factor tan δ) in the capacitive section. One of these two determining variables generally dominates the resonator Q factor. The other determining variable is then practically negligible.

In the resonator type of DE 42 23 909 A1, the Q factor is dominated by the second determining variable, i.e. the dielectric losses in the capacitive section. Transition to lower resonance frequencies requires an increase in the capacitance C, i.e. more or larger capacitors must be used. This increases the dielectric losses in the electric oscillating circuit of the resonator. Since the dielectric losses dominate the Q factor of this resonator type, the resonator Q factor immediately deteriorates.

In contrast thereto, the invention proposes an NMR resonator design with a band-shaped inductive section which has an increased inductance L and a substantially annular cross-section. Due to the two-sided conductive coating of the dielectric foil and the associated electric connections, two conductor loops are effectively provided, thereby quadrupling the inductance L compared to a simple annular arrangement with only one conductor loop, as is disclosed in DE 42 23 909 A1. The slight increase in ohmic losses (resistance R) in the extended inductive section hardly deteriorates the resonator Q factor of the inventive resonator design. Compared to this prior art, the inventive design having the same C in the oscillating circuit (and correspondingly approximately the same resonator Q factor) reduces the resonance frequency by a factor of 2 or considerably improves the resonator Q factor at identical resonance frequency (with quartered C and quadrupled L). Experiments with an inventive NMR resonator with two effective conductor loops yielded an approximately three-times better Q factor compared to a conventional NMR resonator with only one conductor loop at identical resonance frequencies of 10 MHz.

The inventive resonator design is very simple and inexpensive to produce. The foil can be produced through conventional lithographic process techniques including, in particular, printing techniques. The inventive NMR resonator may then substantially be produced by bending the coated foil (closing it in a ring shape with overlapping) and subsequent mounting of the capacitors and of further electric connections. The resonator is particularly compact and requires little space. In particular, the resulting relationship between sample diameter and air gap (of the surrounding magnet) is good. The simple annularly closed resonator design provides good mechanical stability. In a suitable design of the inventive NMR resonator, it is self-supporting and requires, in particular, no support body for electric conductors. The coatings (and thereby the electric conductors) adhere directly to the band-shaped foil, thereby providing the NMR resonator with microphonic stability. This largely eliminates disturbances of the NMR measurement through acoustic oscillations of the NMR resonator or its electric conductors.

In a particularly preferred embodiment of the inventive NMR resonator, the resonance frequency of the NMR resonator is within a range between 1 MHz and 100 MHz, preferably between 5 MHz and 20 MHz. The inventive NMR resonator provides a particularly high resonator Q factor in this frequency range with comparably little construction expense. It is to be noted that the inventive NMR resonator is particularly suited to measure C13 atoms, the measuring frequencies of which are considerably lower than the measuring frequencies of protons with identical static magnetic field.

In one particularly preferred embodiment, the flexible foil is produced from Teflon. Teflon is a robust material that simultaneously provides sufficient flexibility for producing the inventive NMR resonator. In accordance with the invention, the foil typically has a thickness of 0.1 to 1 mm. Teflon (polytetrafluoroethylene) moreover contains no hydrogen and therefore does not disturb the NMR measurement of protons. There is no base signal in proton measurement.

In another preferred embodiment, the conducting coatings of the foil are free from ferromagnetic material. This eliminates magnetic field distortions during NMR measurements.

In a particularly preferred embodiment, the conducting coatings of the foil contain copper and/or silver. These materials have a high specific electric conductivity and are easy to process. The thickness of a simple copper coating is typically between 20 and 100 µm, preferably approximately 35 µm.

In an advantageous embodiment, a protective cover is provided on the conducting coatings of the foil. A suitable coating is e.g. solder resist. If a hydrogen-free protective cover is required in order to avoid a base H signal, a Teflon dispersion may also be applied as the protective cover. The protective cover prevents corrosion of the coatings, in particular of silver-containing coatings. For reasons of simplicity, the protective cover is generally applied over the entire foil, i.e. also on non-coated areas.

In another preferred embodiment, the volume under investigation has a volume of a range between 0.1 $cm^3$ and 10 $cm^3$. The inventive NMR resonator design has proven to be particularly suitable for such small volumes. A typical diameter of a volume under investigation is thereby 0.2 to 1 cm.

In another preferred embodiment, the number of through-connections is between 3 and 10. The current distribution in the coatings (on the outer and inner sides of the foil) can be influenced by the number and the position of the through-connections. The stated number can yield a suitable distribution function with little production expense. It must be noted that, in accordance with the invention, preferably maximally 50% of the axial width of the inductive section is used for through-connections or the associated removal of material of the coatings.

In a preferred embodiment of the inventive NMR resonator, the resonator is designed to produce an axial distribution of the RF current on the band-shaped inductive section during operation, wherein the RF current density in the axially outer areas of the band-shaped inductive section is increased compared to the axially inner area. This current distribution improves the homogeneity of the magnetic component of the RF field in the volume under investigation. The current densities, which are increased in the axial edge area of the inductive section, compensate for the finite extension of the inductive section in the axial direction.

A further development of this embodiment is characterized in that the distribution of the RF current is adjusted by means of a corresponding axial distribution of the positions of the through-connections, and/or a corresponding axial distribution of capacitance values of the capacitors, and/or a corresponding axial distribution of partially circumferential slots in the coating of the flexible foil. The above-mentioned measures adjust the current distribution in a simple fashion.

In one particularly preferred embodiment, the foil, which is coated on both sides, is produced as a printed circuit. Consequently, the inventive NMR resonator is particularly easy and inexpensive to produce. Conventional standard lithographic methods can be used.

In an advantageous further development of this embodiment, the printed circuit comprises coupling structures for coupling in and/or out RF energy. In this fashion, the coupling structures are integrated in a simple fashion in the inventive NMR resonators. Separate coupling structures (e.g. coils) are not required. This not only reduces the production costs but also improves the mechanical stability of the whole NMR resonator, obtaining a particularly compact, space-saving overall construction.

In a preferred further development of this development, the coupling structures are formed in the axial edge areas of the foil. The inductive section or the associated coating on both sides of the foil is generally disposed axially in a central area, and the coupling structures are disposed on the foil on the axial side (on one side or also on both sides) of the inductive section, and are spaced apart therefrom by an uncoated gap. The coupling structures on the foil are simply automatically oriented in a coaxial direction with respect to the inductive section. The axial lateral arrangement of the coupling coils is moreover very compact and does not require any additional space in the radial direction with respect to the inductive section.

The coupling structures are thereby preferably formed substantially symmetrically on both axial edge areas of the foil. This improves the magnetic field homogeneity in the volume under investigation.

In another further development, the coupling structures have strip conductors on both sides of the foil. This increases the inductance of the coupling structures in order to improve coupling in and out.

In another preferred embodiment, the material of the flexible foil and the thickness of the flexible foil, and the material of the coatings as well as the thickness of the coatings are selected in such a fashion that the NMR resonator is self-supporting. The substantially annular inventive resonator design is readily provided with high rigidity in the closed state through suitable selection of the material and of the thickness of the foil and of the coating. For normal operation of the NMR resonator (i.e. for routine NMR measurements), a support body inside the closed foil is not required in order to keep the strip conductors stationary. Any existing coupling structures on the foil are also sufficiently rigid.

The invention also concerns a low-resolution NMR spectrometer comprising an inventive NMR resonator. The inventive NMR resonator is thereby typically disposed inside a permanent magnet of the NMR spectrometer. Low-resolution NMR spectrometers are also called Time Domain Spectrometers or Benchtop spectrometers. An inventive NMR resonator may, in particular, be used in a device of the type "Minispec" of the company Bruker BioSpin GmbH, Rheinstetten, Germany. The inventive NMR spectrometer can provide NMR measurements of good quality at low resonance frequencies and low cost.

Further advantages of the invention can be extracted from the description and the drawing. The features mentioned above and below may be used in accordance with the invention individually or collectively in arbitrary combination. The embodiments shown and described are not to be understood as exhaustive enumeration but have exemplary character for describing the invention.

The invention is illustrated in the drawing and explained in more detail with reference to embodiments.

DESCRIPTION OF THE PREFERRED EMBODIMENT

Figure 1:
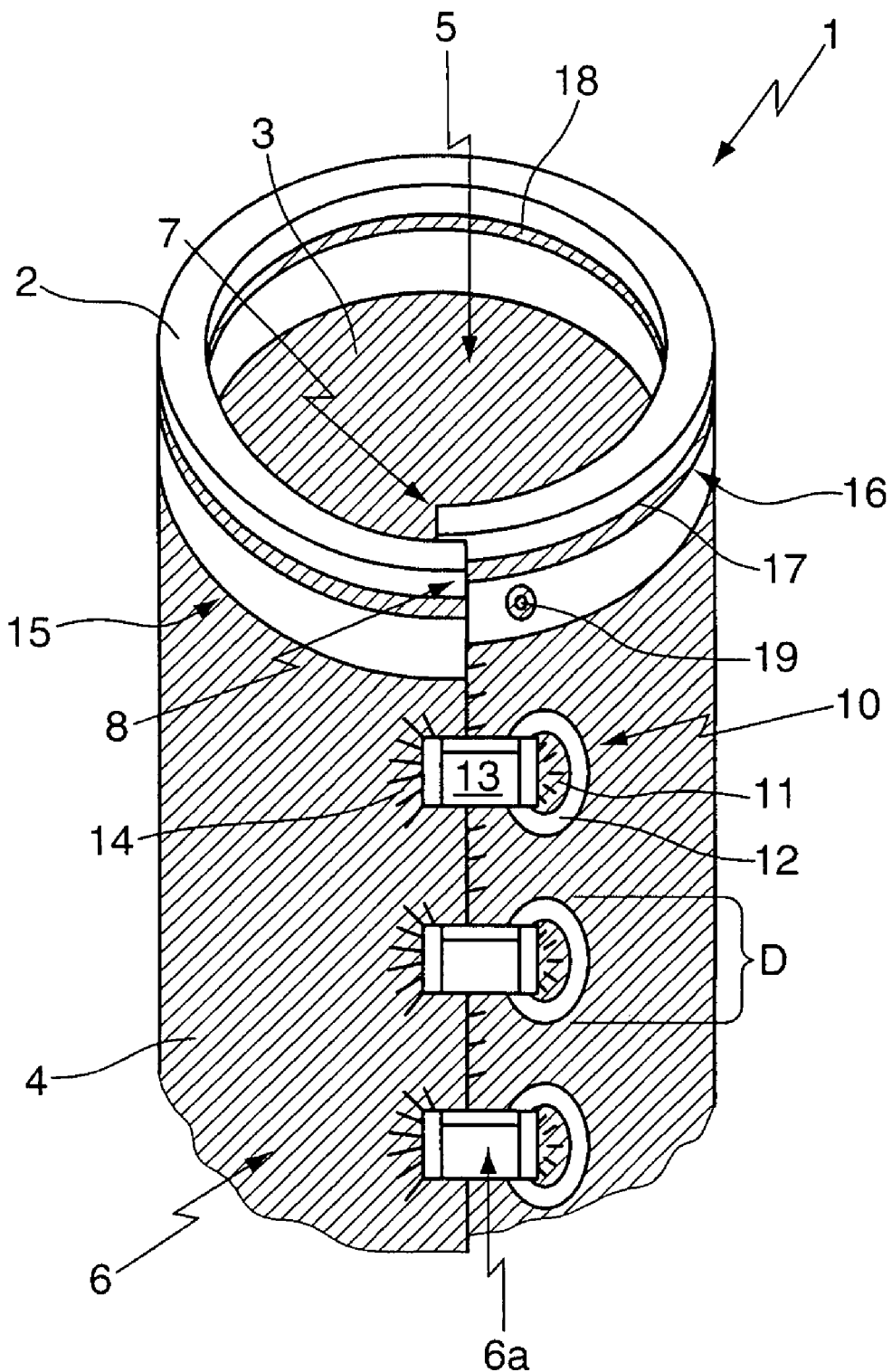
FIG. 1 shows a schematic inclined view of an upper section of an inventive NMR resonator.
Figure 2:
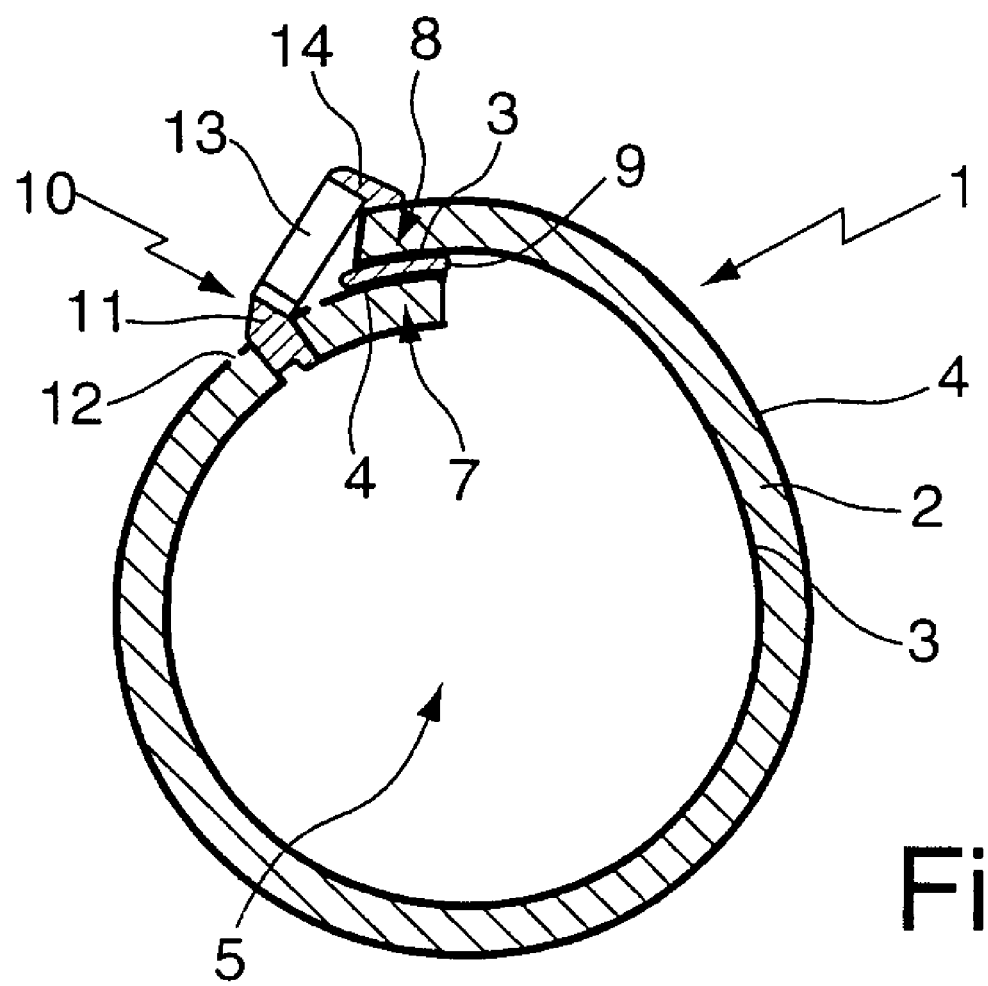
FIG. 2 shows a schematic cross-section through the NMR resonator of FIG. 1 at an axial height of a through-connection.

By way of example, FIGS. 1 and 2 show a schematic inclined view and a cross-sectional view of an inventive NMR resonator 1. The basic body (support body) of the NMR resonator 1 is formed by a flexible foil 2 of an insulating material (in the present case Teflon), which is bent to form an approximately cylinder jacket shape (in the present case a circular cylinder jacket). The foil 2 encloses an approximately circular cylindrical volume under investigation 5 for a sample (not shown).

A flat inner coating 3 of copper is disposed on the radially inner side of the foil 2, and a flat outer coating 4 of copper is disposed on the radially outer side of the foil 2. This double-sided coating 3, 4 of the foil 2 forms a band-shaped inductive section 6 of the NMR resonator 1.

The foil 2 or the band-shaped inductive section 6 has two overlapping ends, i.e. an inner end 7 and an outer end 8. The overlapping thereby only covers a small portion (preferably 1/10 or less) of the periphery of the circular cylinder jacket-shaped bent foil 2. The band-shaped inductive section 6 is capacitively closed by means of several capacitors 13 (preferably MLCC capacitors with preferably little dielectric losses, MLCC=multilayer ceramic chip capacitor). The capacitors 13 form a capacitive section 6a of the NMR resonator 1. It must be noted that the capacitors 13 are discrete electronic components and not e.g. air gaps of the resonator geometry.

As is best illustrated in FIG. 2, which shows a cross-sectional view of FIG. 1 perpendicularly to the axial direction, a solder contact 9 connects the outer coating 4 of the inner end 7 to the inner coating 3 of the outer end 8 in the overlapping area and in an electrically conducting fashion.

Through-connections 10 are moreover provided in the foil 2 in the area of the inner end 7, i.e. shortly before the overlapping area. Each through-connection 10 has a bore through the foil 2, through which the inner coating 3 is contacted in the area of the inner end 7, in particular, by means of a solder contact 11. The copper coating has an annular gap 12 around the through-connections 10 on the outer side of the foil 2 for insulation. The gap 12 has a diameter D in the axial direction. The solder contact 11 is connected to a capacitor 13 whose other end is connected to the outer coating 4 in the area of the outer end 8 by means of a further solder contact 14.

The resulting overall electric oscillating circuit in the NMR resonator has the following order: capacitor 13—outer coating 4 in the area of the outer end 8—annular conductor loop on the outer coating 4—outer coating 4 in the area of the inner end 7—solder contact 9—inner coating 3 in the area of the outer end 8—annular conductor loop on the inner coating 3—inner coating 3 in the area of the inner end 7—through-connection 10—solder contact 11—capacitor 13. An annular conductor loop is thereby passed two times altogether.

The foil 2 projects past the axial end 15 (see FIG. 1) of the coatings 3, 4. Coupling structures 16 are disposed on the foil 2 axially laterally with respect to the coatings 3, 4, which comprise, in particular, annular strip conductors 17 on the outer side of the foil 2 and annular strip conductors 18 on the inner side of the foil 2. The coupling structures 16 are used to couple RF energy in and out during an NMR measurement of a sample which is disposed in the volume under investigation 5. The coupling structures 16 have their own through-connections 19.

An inventive NMR resonator is produced e.g. as a printed circuit, wherein the front and rear sides of an initially flat flexible foil are coated with copper. The through-connections are then drilled and subsequently provided with copper sleeves in a galvanic method, which provide the conducting connections of the two copper sides. The foil prepared in this fashion is then coated with light-sensitive varnish. After exposure through a photomaster of the desired structure, developing and etching, the photomaster is transferred to the copper layer. The exposed areas are thereby completely etched. This method is carried out for both sides of the foil. The light-sensitive protective varnish is then washed off with the corresponding solvent to yield a foil with the desired structures. Other methods for producing the foil, e.g. milling and sputtering, are also feasible, wherein the first-mentioned is the least expensive method.

The flexible foil is considerably reinforced by coating it with copper. It can, however, still be deformed with little force. The copper coating on both sides thereby causes permanent deformation. The coated foil is usually formed to a circular cylinder jacket shape (see FIG. 1). A circular cylindrical deformation aid may thereby be temporarily used. This is followed by soldering work for the contacts, in particular, at the through-connections and the capacitors.

Figure 3:
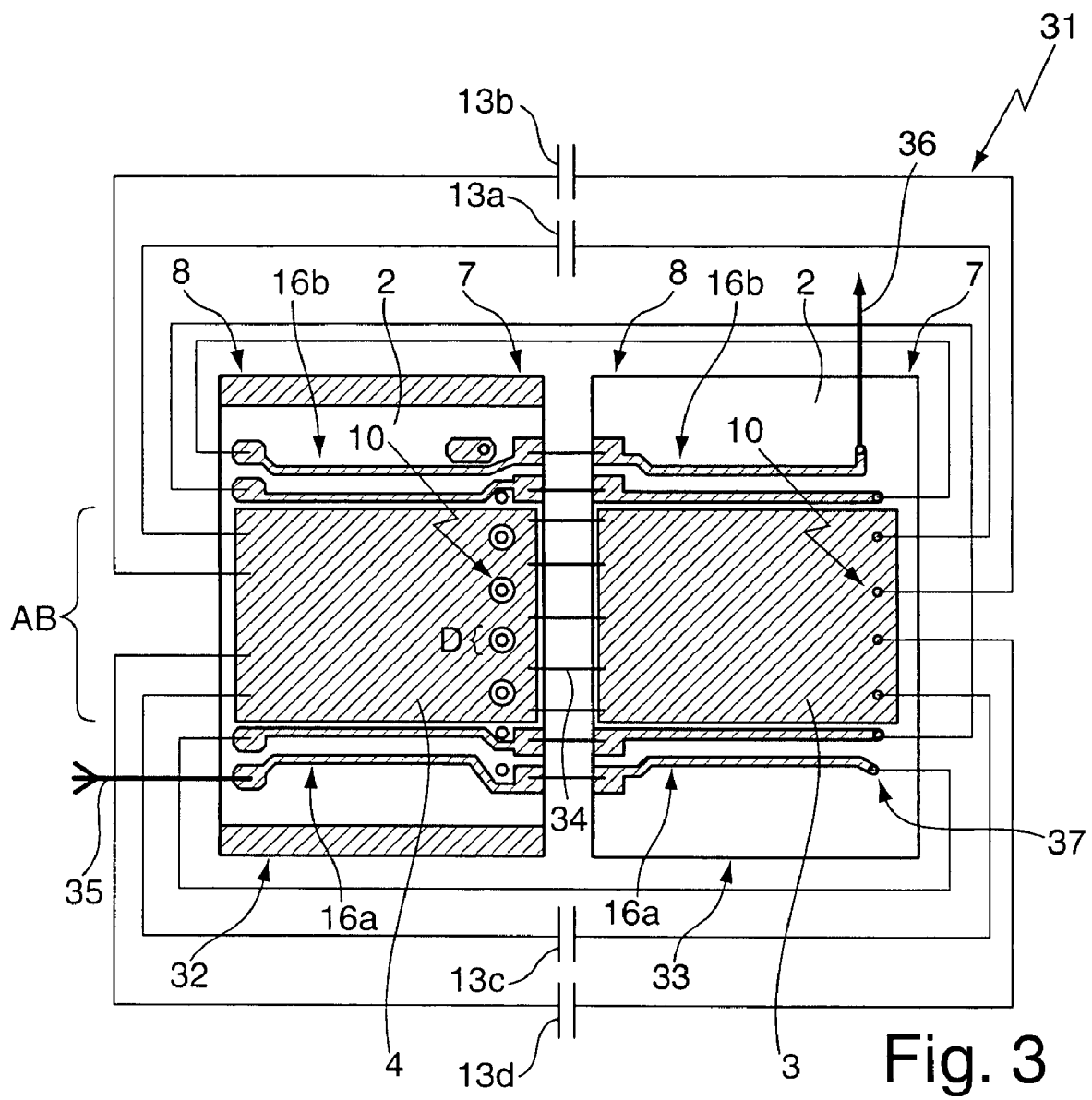
FIG. 3 shows a schematic view of the outer and inner sides of a foil of an inventive NMR resonator in the unwound state, including electric wiring.

FIG. 3 shows a schematic view of the outer side 32 and the inner side 33 of a rectangular foil 2 of an inventive NMR resonator 31 (similar to the NMR resonator of FIG. 1) in the unwound (flat) state. The conducting areas (copper coatings) on the foil 2 are dark colored. FIG. 3 also shows the electric connections and wirings in the finished state. The inner ends 7 and outer ends 8 in the finished state (compare FIGS. 1, 2) of the two sides 32, 33 are marked. The axial direction extends from the top to the bottom in FIG. 3.

The major part of the outer side 32 of the foil 2 is coated with an outer coating 4 of copper. Electric contacts 34 (compare also the solder contact 9 in FIG. 2) to the outer end 8 of an inner coating 3 of the inner side 33 are provided in the area of the inner end 7. Through-connections 10 are provided at the inner end 7 of the inner coating 3, via which the inner coating 3 is connected to the outer coating 4 in the area of the outer end 8 via capacitors 13a, 13b, 13c, 13d.

The two axially outwardly connected capacitors 13a and 13c have a higher capacitance value than the axially inwardly connected capacitors 13b and 13d for adjusting the axial current density within the inner coating 3 and the outer coating 4. The sum of the axial diameters D of the insulating areas (coating gaps) of the through-connections 10 (compare also FIG. 1) also preferably amounts to maximally 50% of the axial width AB of the coating 3 in order to ensure sufficient current flow over the entire width of the coatings 3, 4. In the illustrated example with four identical through-connections 10, this condition is $4*D \leq 0.5*AB$.

Coupling structures 16a, 16b are provided on the axial sides of the inner and outer coatings 3, 4. The coupling structures 16a, 16b may be connected to the electronics of an NMR spectrometer through the contacts 35 and 36 (coupling start/end). It must be noted that the coupling structures 16a, 16b comprise a total of eight series-connected conductor loops, four of which extend on the outer side 32 and four on the inner side 33 of the foil 2. The coupling structures 16a, 16b remain on the foil 2 as a copper coating (like the inner and outer coatings 3, 4). The coupling structures 16a extend on the axially lower side in FIG. 3, and the coupling structures 16b extend on the axially upper side of the foil 2. The coupling structures 16a and 16b (in particular the positions of the strip conductors) are substantially mirror-symmetrical with respect to a mirror plane that extends perpendicularly to the axial direction and divides the NMR resonator 31 in the center (not shown). The coupling structures 16a, 16b comprise a total of four through-connections 37.

In summary, the invention proposes to provide an NMR resonator comprising a sleeve-shaped inductive section with an insulating sleeve carrier with a conductive coating both on the outer side and on the inner side, and to connect the two coatings in series with current flow in a same direction. The overlapping ends of the sleeve carrier are capacitively closed via capacitor components. In this NMR resonator, two conductor loops can be utilized by means of the mechanically stable and simple construction of a simple sleeve, thereby increasing the inductance. In this fashion, smaller capacitances may be used for NMR resonators for lower frequencies (around 20 MHz and below), thereby reducing the dielectric losses in the NMR resonator and increasing the quality of NMR measurements.

We claim:

1. A nuclear magnetic resonance (NMR) resonator comprising:
   a flexible dielectric foil having a first end region and a second end region, said foil rolled into a substantially cylindrical shape such that said first end region overlaps with and is radially outside of said second end region, said foil constituting an inductive section, wherein said foil has at least one through-hole extending through said foil at said second end region;
   a first conductive coating disposed on an outside of said foil;
   a second conductive coating disposed on an inside of said foil;
   means for electrically connecting said second conductive coating at said first end region to said first conductive coating at said second end region; and
   at least one discrete capacitor connected between said first conductive coating at said first end region and said second conductive coating at said second end region via said through-hole to form a capacitive section.

2. The NMR resonator of claim 1, wherein a resonator frequency of the NMR resonator is within a range of between 1 MHz and 100 MHz or between 5 MHz and 20 MHz.

3. The NMR resonator of claim 1, wherein said flexible foil is produced from Teflon.

4. The NMR resonator of claim 1, wherein said first and said second conductive coatings of said foil are free from ferromagnetic material.

5. The NMR resonator of claim 1, wherein said first and said second conductive coatings of said foil contain copper and/or silver.

6. The NMR resonator of claim 1, further comprising a protective cover disposed on said first and said second conductive coatings.

7. The NMR resonator of claim 1, wherein a volume under investigation has a volume in a range between 0.1 cm$^3$ and 10 cm$^3$.

8. The NMR resonator of claim 1, wherein a number of through-holes is between 3 and 10.

9. The NMR resonator of claim 1, wherein the NMR resonator is designed such that RF current is axially distributed to said inductive section during operation, wherein an RF current density in axially outer areas of said inductive section is increased with respect to an axially inner area.

10. The NMR resonator of claim 9, wherein a distribution of RF current is adjusted by means of a corresponding axial distribution of positions of through-holes and through-connections and/or a corresponding axial distribution of capacitance values of said at least one capacitor, and/or a corresponding axial distribution of partially circumferential slots in said first and said second coatings.

11. The NMR resonator of claim 1, wherein said foil and said first and second coatings are produced as a printed circuit.

12. The NMR resonator of claim 11, wherein said printed circuit comprises coupling structures for coupling RF energy in and/or out.

13. The NMR resonator of claim 12, wherein said coupling structures are formed in an axial edge area of said foil.

14. The NMR resonator of claim 13, wherein said coupling structures are formed largely symmetrically at both axial edge areas of said foil.

15. The NMR resonator of claim 12, wherein said coupling structures comprise strip conductors on both sides of said foil.

16. The NMR resonator of claim 1, wherein a material of said flexible foil and a thickness of said flexible foil and a material of said first and said second coatings and a thickness of said first and said second coatings are selected such that the NMR resonator is self-supporting.

17. A low-resolution NMR spectrometer comprising the NMR resonator of claim 1.

* * * * *